United States Patent
Ciaccio

(10) Patent No.: US 11,297,718 B2
(45) Date of Patent: Apr. 5, 2022

(54) METHODS OF MANUFACTURING FLEX CIRCUITS WITH MECHANICALLY FORMED CONDUCTIVE TRACES

(71) Applicant: Gentherm GmbH, Odelzhausen (DE)

(72) Inventor: Michael Peter Ciaccio, Chelsea, MI (US)

(73) Assignee: Gentherm GmbH, Odelzhausen (DE)

( * ) Notice: Subject to any disclaimer, the term of this patent is extended or adjusted under 35 U.S.C. 154(b) by 0 days.

(21) Appl. No.: 16/916,324

(22) Filed: Jun. 30, 2020

(65) Prior Publication Data

US 2021/0410290 A1 Dec. 30, 2021

(51) Int. Cl.
| | |
|---|---|
| *H05K 3/00* | (2006.01) |
| *H05K 1/03* | (2006.01) |
| *H05K 3/36* | (2006.01) |
| *H05K 3/28* | (2006.01) |
| *H05K 1/11* | (2006.01) |

(52) U.S. Cl.
CPC ......... *H05K 3/0058* (2013.01); *H05K 1/0393* (2013.01); *H05K 1/118* (2013.01); *H05K 3/28* (2013.01); *H05K 3/361* (2013.01)

(58) Field of Classification Search
CPC ........ H05K 3/0058; H05K 3/28; H05K 3/361; H05K 1/0393; H05K 1/118; H01L 23/057; Y10T 29/49126; Y10T 29/4913; Y10T 29/49144; Y10T 29/49146; Y10T 29/49155
USPC .......................... 29/830, 832, 840, 841, 846
See application file for complete search history.

(56) References Cited

U.S. PATENT DOCUMENTS

| | | | | |
|---|---|---|---|---|
| 4,791,075 A | * | 12/1988 | Lin | H01L 23/057 29/841 |
| 4,963,974 A | * | 10/1990 | Ushio | C23C 18/44 174/250 |
| 6,090,728 A | * | 7/2000 | Yenni, Jr | H05K 9/0026 174/359 |

(Continued)

FOREIGN PATENT DOCUMENTS

JP 2008205492 A 9/2008

OTHER PUBLICATIONS

U.S. Appl. No. 16/587,292, filed Sep. 30, 2019, Hughes.

(Continued)

*Primary Examiner* — Donghai D Nguyen

(57) ABSTRACT

A method of manufacturing a flexible circuit comprises providing a laminated substrate that includes a conductive layer, an adhesive layer, and a support layer. The method comprises forming conductive traces by removing selected portions of the conductive layer and the adhesive layer by dry milling the laminated substrate. The method comprises applying a protective coating to the conductive traces. The method comprises dispensing a solder material on the protective coating at a first connection point and arranging a first component at the first connection point. The method comprises heating the solder material to remove the protective coating from the first connection point and to connect the first component to one of the conductive traces at the first connection point. The method comprises attaching a second component to the conductive layer at a second connection point that is free of the protective coating by a process other than soldering.

19 Claims, 9 Drawing Sheets

(56) References Cited

U.S. PATENT DOCUMENTS

| | | | |
|---|---|---|---|
| 6,263,564 B1* | 7/2001 | Holmberg | H05K 9/0028 29/840 |
| 6,543,130 B1* | 4/2003 | Wittmaier | H05K 3/043 29/846 |
| 7,919,027 B2 | 4/2011 | Nordlinder et al. | |
| 10,667,394 B1 | 5/2020 | Ciaccio | |
| 2013/0322034 A1 | 12/2013 | Lechleiter | |
| 2015/0152002 A1 | 6/2015 | DeAngelis et al. | |
| 2015/0280039 A1 | 10/2015 | Baccini et al. | |
| 2019/0152002 A1 | 5/2019 | Vinson et al. | |

OTHER PUBLICATIONS

"Mina—Facile Soldering to Aluminum for RFIDs". www.averatekcorp.com; 4 pages.
International Search Report and Written Opinion for International Application No. PCT/US2021/037987 dated Dec. 1, 2021.

* cited by examiner

METHODS OF MANUFACTURING FLEX CIRCUITS WITH MECHANICALLY FORMED CONDUCTIVE TRACES

FIELD

The present disclosure relates generally to manufacturing flexible (flex) circuits, and more particularly to methods of manufacturing flex circuits with mechanically formed conductive traces.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Assembling flexible circuits often involves electrically bonding electrical components to electrically conductive traces formed on substrates. Although use of solder is preferred to electrically bond components to conductive traces, soldering the components to copper or aluminum traces can be difficult due to a thin layer of oxide and/or contaminants that forms on the surface of the conductive traces. The oxide layer forms when the bare metal of the conductive traces is exposed to air. Since the manufacturing of flexible circuits is performed in conditions which include air, the conductive traces often become covered with the oxide layer. The oxide layer reduces the effectiveness of electrical bonding and physical connection of the solder material to the base metal of the conductive trace. For this reason, assembly of most flexible circuits utilizes a flux process to clean and prepare surfaces to be electrically bonded immediately before the soldering process.

For aluminum in particular, tough oxides on the surface prevent wetting (formation of the inter-metallic layers), causing the solder to form balls rather than wetting and adhering to the surface to provide a good electrical connection. For this reason, aluminum rigid or flexible electrical circuits are rarely used. In some cases, aluminum flexible circuits are used with electrically conductive glue to connect electrical components in order to avoid the soldering process and the inherent wetting and soldering issues.

Further, contaminants such as residual chemicals from the processes used to manufacture and/or clean the conductive traces or other portions of the flexible circuit may be present on the flexible circuit in varying amounts. For example, the flux process may leave residual chemicals on or around the surfaces to be electrically bonded. Also, manufacturing processes used to form the conductive traces such as printing or chemical etching may also leave residual chemicals or contaminants. The residual chemicals or contaminants may also prevent optimal electrical bond and physical connection to the conductive traces.

The residual chemicals may inhibit optimal electrical or physical connection of components to the conductive traces, or cause additional contaminants to adhere to the conductive traces or the substrate. In situations where additional subsequent processing of the substrate is required, the residual chemicals may be expelled from or interfere with the subsequent process such as soldering of electrical components to the conductive traces. Thus, these manufacturing processes utilize and/or output chemicals that can not only impact the connection of components to the conductive traces but also harm the environment.

SUMMARY

A method of manufacturing a flexible circuit comprises providing a laminated substrate that includes a conductive layer, an adhesive layer, and a support layer. The method comprises forming conductive traces by removing selected portions of the conductive layer and the adhesive layer by dry milling the laminated substrate. The method comprises applying a protective coating to the conductive traces. The method comprises dispensing a solder material on the protective coating at a first connection point and arranging a first component at the first connection point. The method comprises heating the solder material to remove the protective coating from the first connection point and to connect the first component to one of the conductive traces at the first connection point. The method comprises attaching a second component to the conductive layer at a second connection point by a process other than soldering. The second connection point is free of the protective coating.

In another feature, the method further comprises, prior to dispensing the solder material, curing the protective coating by heating the protective coating.

In another feature, the support layer includes a material selected from a group consisting of polyethylene terephthalate (PET), polyethylene naphthalate (PEN), and polyimide (PI).

In another feature, the conductive layer includes aluminum.

In another feature, the second component includes a bus-bar made of aluminum.

In another feature, the second component includes a conductor made of a different material than the conductive layer.

In another feature, the method further comprises covering the first component and the conductive traces with a conformal coating.

In other features, the second component includes a bus-bar, and the process includes ultrasonic welding.

In another feature, the method further comprises covering the first component, the conductive traces, and a weld at second connection point with a conformal coating.

In another feature, the method further comprises, prior to applying the protective coating, applying a cover layer over the conductive traces.

In another feature, the cover layer includes windows for components to connect to the conductive traces.

In another feature, the cover layer and the support layer include a material selected from a group consisting of polyethylene terephthalate (PET), polyethylene naphthalate (PEN), and polyimide (PI).

In another feature, the method further comprises, subsequent to heating the solder material and prior to attaching the second component, covering the first component and areas between the windows in the cover layer with a conformal coating.

In other features, the second component includes a bus-bar, and the process includes ultrasonic welding.

In another feature, the bus-bar is made of a different conductive material than the conductive layer.

In another feature, the method further comprises covering a weld at second connection point with the conformal coating.

In other features, the method further comprises, subsequent to heating the solder material and prior to attaching the second component, covering the first component and the conductive traces with a conformal coating. The second component includes a bus-bar, and the process includes ultrasonic welding. The bus-bar is made from a different conductive material than the conductive layer. The method further comprises covering a weld at second connection point with the conformal coating.

In still other features, a flexible circuit comprises a laminated substrate comprising a support layer and a conductive layer arranged on the support layer. The conductive layer includes conductive traces. Edges of the conductive traces taper outwardly and towards the support layer. The flexible circuit comprises a layer of a protective coating deposited on the conductive traces. The flexible circuit comprises a first component soldered at a first connection point on one of the conductive traces. The soldering sublimates the protective coating. The flexible circuit comprises a second component welded to the conductive layer at a second connection point. The second connection point is free of the protective coating.

In another feature, the flex circuit further comprises an adhesive layer disposed between the conductive layer and the support layer. The edges of the adhesive layer taper outwardly and towards the support layer. The edges of the adhesive layer are aligned with the edges of the conductive traces.

In another feature, the support layer includes a material selected from a group consisting of polyethylene terephthalate (PET), polyethylene naphthalate (PEN), and polyimide (PI).

In another feature, the conductive layer includes aluminum.

In another feature, the second component includes a bus-bar made of aluminum.

In another feature, the second component includes a conductor made of a different material than the conductive layer.

In another feature, the flex circuit further comprises a conformal coating covering the first component and the conductive traces.

In another feature, the flex circuit further comprises a conformal coating covering the first component, the conductive traces, and a weld at second connection point.

In another feature, the flex circuit further comprises a cover layer arranged over the conductive traces. The cover layer includes windows for components to connect to the conductive traces.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
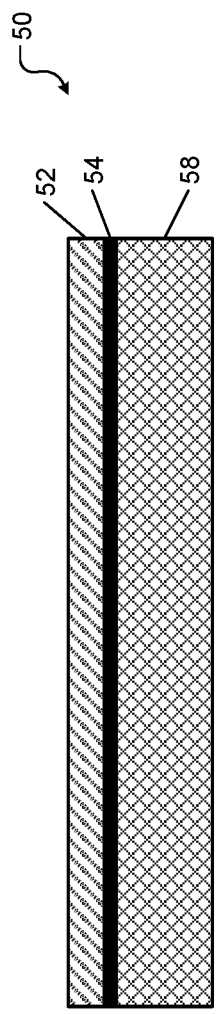
FIG. 1 is a side cross-sectional view of an example of a laminated substrate including a conductive layer, an adhesive layer, and a support layer according to the present disclosure.

The present disclosure relates to methods of manufacturing flexible (flex) circuits. The flex circuits include substrates with conductive traces formed by a mechanical process such as dry milling a conductive layer on the substrates. The methods use a soldering process to solder components to the conductive traces and a different mechanical process such as ultrasonic welding to attach or bond other components such as conductors (e.g., bus-bars) to the conductive layer of the flex circuits. In some examples, the conductive layer and the conductors are made of the same material such as aluminum. In some examples, the conductive layer is made of aluminum while the bus-bars are made of a different conductive material. In addition, the methods apply various protective coatings, cover layers, and conformal coatings to protect the conductive traces, the components, and optionally the welds on the flex circuits at different stages of manufactures the flex circuits. These and other features of the present disclosure are described below in detail.

In mass-scale manufacturing of flex circuits, forming several electrical and mechanical bonds with conductive traces and components having differing properties may be required at various stages. Some of the components may not be suitable for heating to high temperatures, which may be required in a soldering process. For example, in some applications, a polymeric member may be attached to the flex circuit to maintain the orientation and spacing of the flex circuit; and heating from a solder process, such as in a reflow oven, may damage or deform the polymeric member.

In some applications, the order of the manufacturing process may not allow formation of multiple electrical and mechanical bonds with the conductive traces at the same time. For example, a second electrical and mechanical bond is made to a conductive member that is affixed to a polymeric member that positions the conductive member. The heating from a solder process, such as in a reflow oven, may damage or deform the polymeric member. Also, the conductive member or the polymeric member may not be repeatably positioned relative to the conductive traces to achieve the exact location and tolerances required for soldering, particularly when the width of the conductive traces is narrow.

In some applications, the conductive traces are electrically and mechanically bonded to another component that does not accept a conventional solder process. For example, the other component to be bonded to the conductive traces may be relatively large and thus have a relatively large thermal inertia, which resists rapid heating required in a mass-scale manufacturing solder process. Also, in some instances, the materials of the other component may not be suitable for direct attachment to a conductive trace, either due to an oxide layer formed on the exposed surface of the conductive traces, or due to a protective coating applied to the other component. Further, the other component may also be composed of a different constituent material or may include different elements than those of the conductive traces, which may impair the electrical and mechanical bonding therebetween. Accordingly, a second process different than heating and soldering in a reflow oven may be required to attach the other component to the conductive traces.

The present disclosure provides methods to manufacture flex circuits in mass-scale production. In these methods, the conductive traces are formed by a mechanical structuring manufacturing process that does not result in residual chemicals or contaminants. The conductive traces have a first connection point that is electrically and mechanically bonded to a first component by a first process. The conductive traces have a second connection point that is electrically and mechanically bonded to a second component by a second process. The second process is different than the first process and is performed at a different step in the manufacturing process than the first process. These methods allow use of different materials in the conductive traces and the second component.

FIG. 1 shows a laminated substrate 50. The laminated substrate 50 includes a conductive layer 52 attached by an adhesive layer 54 to a support layer 58. In some examples, the support layer 58 is a flexible layer. In some examples, the support layer includes polyethylene terephthalate (PET), polyethylene naphthalate (PEN), or polyimide (PI) layer, although other types of support layers can be used. In some examples, the conductive layer 52 includes copper, aluminum, an alloy, or another conductive material.

Figure 2:
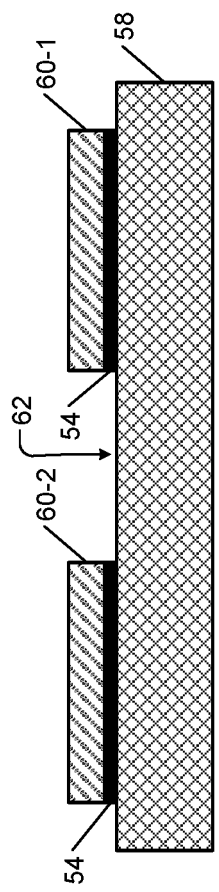
FIG. 2 is a side cross-sectional view of an example of the laminated substrate of FIG. 1 with dry milled conductive traces according to the present disclosure.

FIG. 2 shows conductive traces formed by a mechanical process such as dry milling. For example, the conductive layer 52 and the adhesive layer 54 of the laminated substrate 50 of FIG. 1 are dry milled to define one or more conductive traces 60-1, 60-2 (collectively conductive traces 60). While only two conductive traces 60 are shown for simplicity of illustration, a plurality of conductive traces 60 can be formed. Specifically, portions of the conductive layer 52 and the adhesive layer 54 are removed (e.g., at 62) using the dry milling process to create the conductive traces 60.

A suitable example of a dry milling process is shown and described in commonly owned U.S. Pat. No. 7,919,027 issued on Apr. 5, 2011 and entitled "Methods and Devices for Manufacturing of Electrical Components and Laminated Structures", which is hereby incorporated herein by reference in its entirety.

During dry milling, a web of the laminated substrate 50 is fed between a milling wheel and a cliché. The cliché includes a pattern with raised and non-raised portions. The raised portions of the pattern push the laminated substrate 50 into the milling wheel in regions adjacent to the raised portions. The non-raised portions are not milled. The non-raised portions of the pattern define the conductive traces 60 in the conductive layer 52. The raised portions of the pattern define regions between the traces where the conductive layer 52 and the adhesive layer 54 are removed. The use of a mechanical process such as dry milling to create the conductive traces 60 eliminates the use of residual chemicals.

Additional processes used to manufacture conductive traces of flex circuits without using harmful chemicals are shown and described in commonly owned U.S. Pat. No. 10,667,394 issued on May 26, 2020 and entitled "Double-Sided, Single Conductor Laminated Substrate" and commonly owned U.S. patent application Ser. No. 16/587,292 filed on Sep. 30, 2019 and entitled "Dual Conductor Laminated Substrate", the entire disclosures of which are hereby incorporated herein by reference.

Figure 3:
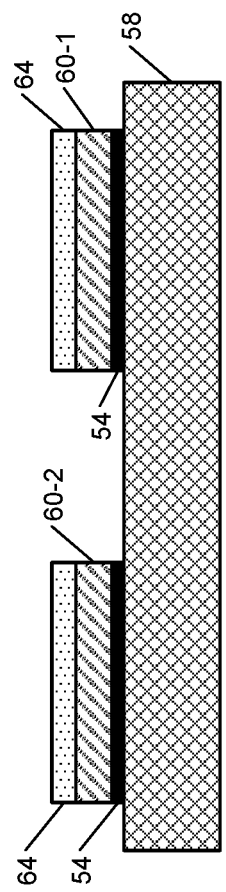
FIG. 3 is a side cross-sectional view of an example of the laminated substrate of FIG. 2 with a protective coating applied to the conductive traces according to the present disclosure.

FIG. 3 shows application of a protective coating 64 to the conductive traces 60. After the mechanical structuring, layers of oxide and other contaminants may form on portions of the conductive traces 60. To prevent formation of such layers and to protect the conductive traces 60 from oxidation and/or other contaminants, a protective coating 64 is applied to the conductive traces 60 as shown in FIG. 3. The protective coating may also be optionally applied to a portion of the support layer 58.

For example, the protective coating 64 can include compositions prepared as aqueous solutions or suspensions that can be applied to the aluminum surface to be soldered (e.g., the conductive traces 60 and other non-milled portions of the conductive layer 52) using printing techniques. The printable composition can be supplied as a gel or a cream. The composition can be cured, if necessary, by heating the structure shown in FIG. 3 at low temperatures that are compatible with plastic/polymer components of mass produced flex circuits.

Figure 4:
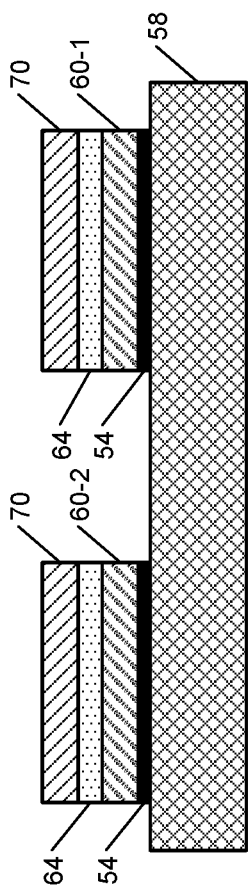
FIG. 4 is a side cross-sectional view of an example of the laminated substrate of FIG. 3 with a solder material deposited on the protective coating according to the present disclosure.

FIG. 4 shows a solder material 70 dispensed or deposited on the protective coating 64. The solder material 70 melts when heated. Before heating the solder material, a component such as an electronic component is arranged on the solder material 70. For example, the electronic component may include a surface mount device (SMD), an application specific integrated circuit (ASIC), or any other component.

Figure 5:
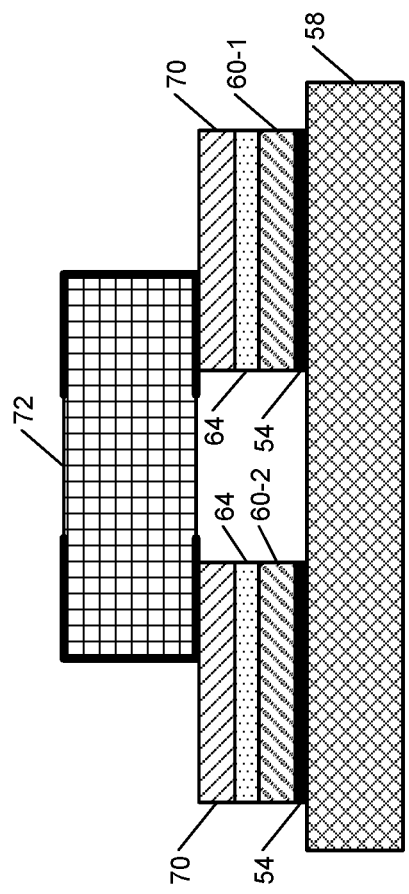
FIG. 5 is a side cross-sectional view of an example of the laminated substrate of FIG. 4 with an electronic component arranged on the solder material according to the present disclosure.

FIG. 5 shows an electronic component 72 arranged on the solder material 70 prior to heating the solder material 70. Although only one component is shown for simplicity of illustration, multiple components can be arranged (e.g., see FIGS. 7 and 8).

Figure 6:
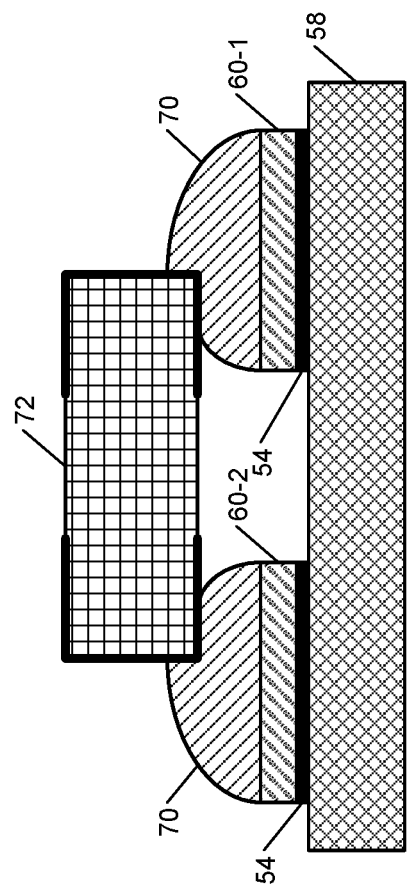
FIG. 6 is a side cross-sectional view of an example of the laminated substrate of FIG. 5 with the electronic component soldered to the conductive traces and with the protective coating sublimated during the soldering process according to the present disclosure.

FIG. 6 shows the electronic component 72 connected to the conductive traces 60 by the solder material 70 when the solder material 70 is heated. The protective coating 64 is removed during the heating process, such as the soldering process performed in a reflow oven or by localized heating of the protective coating, to expose portions of the conductive traces 60. The exposed portions of the conductive traces 60 are connected by the melted solder material 70 to components such as the electronic component 72 to provide electrical connections therebetween.

Figure 7:
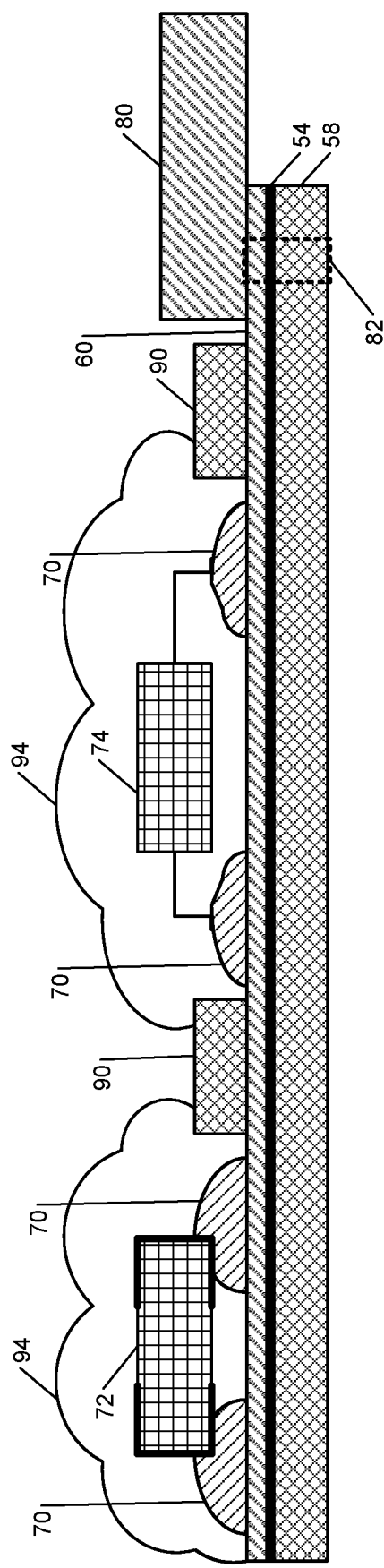
FIG. 7 is a side cross-sectional view of an example of the laminated substrate of FIG. 6 with another component and a conductor connected to the conductive traces and including a cover layer and a conformal coating according to the present disclosure.
Figure 8:
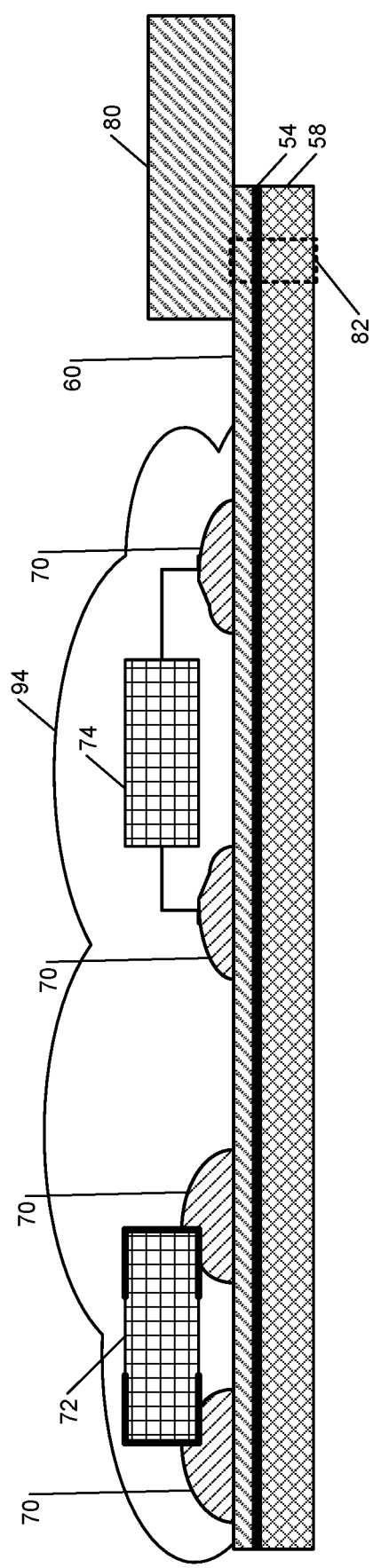
FIG. 8 is a side cross-sectional view of an example of the laminated substrate of FIG. 6 with another component and a conductor connected to the conductive traces and including a conformal coating according to the present disclosure.

FIGS. 7 and 8 show examples of an additional conductor (e.g., a bus-bar) 80 attached to the conductive traces 60. In some examples, the conductor 80 is mechanically connected to the conductive trace 60 to further eliminate residual chemicals such as solvents, cleaners, fluxes, and solders that are conventionally used to connect conductors to the conductive traces 60. In the examples shown, the conductor 80 is attached to the conductive trace 60 by ultrasonic welding (shown at 82).

FIGS. 7 and 8 show additional coatings or covers that can be applied to the laminated substrate 58, the conductive traces 60, and/or the components soldered onto the conductive traces 60 to protect these elements from environmental and/or operational disturbances.

For example, in FIG. 7, prior to performing the soldering process (i.e., before dispensing the solder material 70 shown in FIG. 3), a cover layer 90 is applied over the conductive traces 60. The cover layer 90 includes windows (gaps) for components to be attached to the conductive traces 60. Additionally, after soldering the components (e.g., the SMD 72 and an ASIC 74 shown rotated by 90 degrees) to the conductive traces 60, a conformal coating 94 is applied to encapsulate the components and areas in the windows in the cover layer 90.

The areas in the windows in the cover layer 90 include portions of the conductive traces 60 from which the protective coating 64 is removed during the soldering process. The conformal coating 94 encapsulates and protects the components 72, 74 and the portions of the conductive traces 60 that are exposed after the soldering process. The conformal coating 94 may be applied before or after the conductor 80 is attached to the conductive traces 60 (as described below with reference to FIG. 10).

In FIG. 8, the cover layer 90 is not used. Instead, the conformal coating 94 is applied to encapsulate the components 72, 74 and the portions of the conductive traces 60 that become exposed after the soldering process. The conformal coating 94 may be applied before or after the conductor 80 is attached to the conductive traces 60 (as described below with reference to FIG. 11).

In situations where a subsequent processing step for making a second connection to the conducting trace 60 is performed (e.g., when connecting the conductor 80), the portion of the conducting traces 60 at which the second connection is made may be in one of the following conditions. The portion may be coated with a composition/surface treatment and is heated to remove oxidation or contaminants. The portion may be coated with a composition/surface treatment and is not heated to remove oxidation or contaminants. The portion may be masked by a mask member that is removed before the second connection is made. The portion may not be coated with any material. Regardless of the condition, the second connection can be made using the methods of the present disclosure.

The layers of the flex circuit described herein can include different materials, and the different materials can be of different thicknesses as indicated in some of the following examples. In some examples, the laminated substrate 50 may include the conductive layer 52 of a 10 micron Aluminum 1235 alloy arranged on a 38 micron PET support layer 58 (with the adhesive layer 54 in between). In some examples, the laminated substrate 50 can optionally include a PET cover layer 90. Also, in some examples, the conformal coating 94 could be used in place of the cover layer 90 and can be dispensed after soldering the components or after assembly into a frame with ultrasonically welded bus-bars.

Alternatively, the laminated substrate 50 may include the conductive layer 52 of 9-10 micron Aluminum arranged on a Polyimide (PI) support layer 58, the conductive layer 52 of 9-10 micron Aluminum arranged on a PET support layer 58, or the conductive layer 52 of 9-10 micron aluminum arranged on a PEN support layer 58. In these examples, the thickness of the support layer 58 may range from 38 to 50 microns. The thickness of the adhesive layer 54 can be about 25 microns. In other examples, the thickness of the conductive layer 52 of aluminum can also be about 18 microns. The thickness of the conductive layer 52 of aluminum may also be about 35 microns. The cover layer 90 is made of the same material as the support layer 58. That is, the cover layer 90 can be made of PET, PI, or PEN as the support layer 58.

Figure 9:
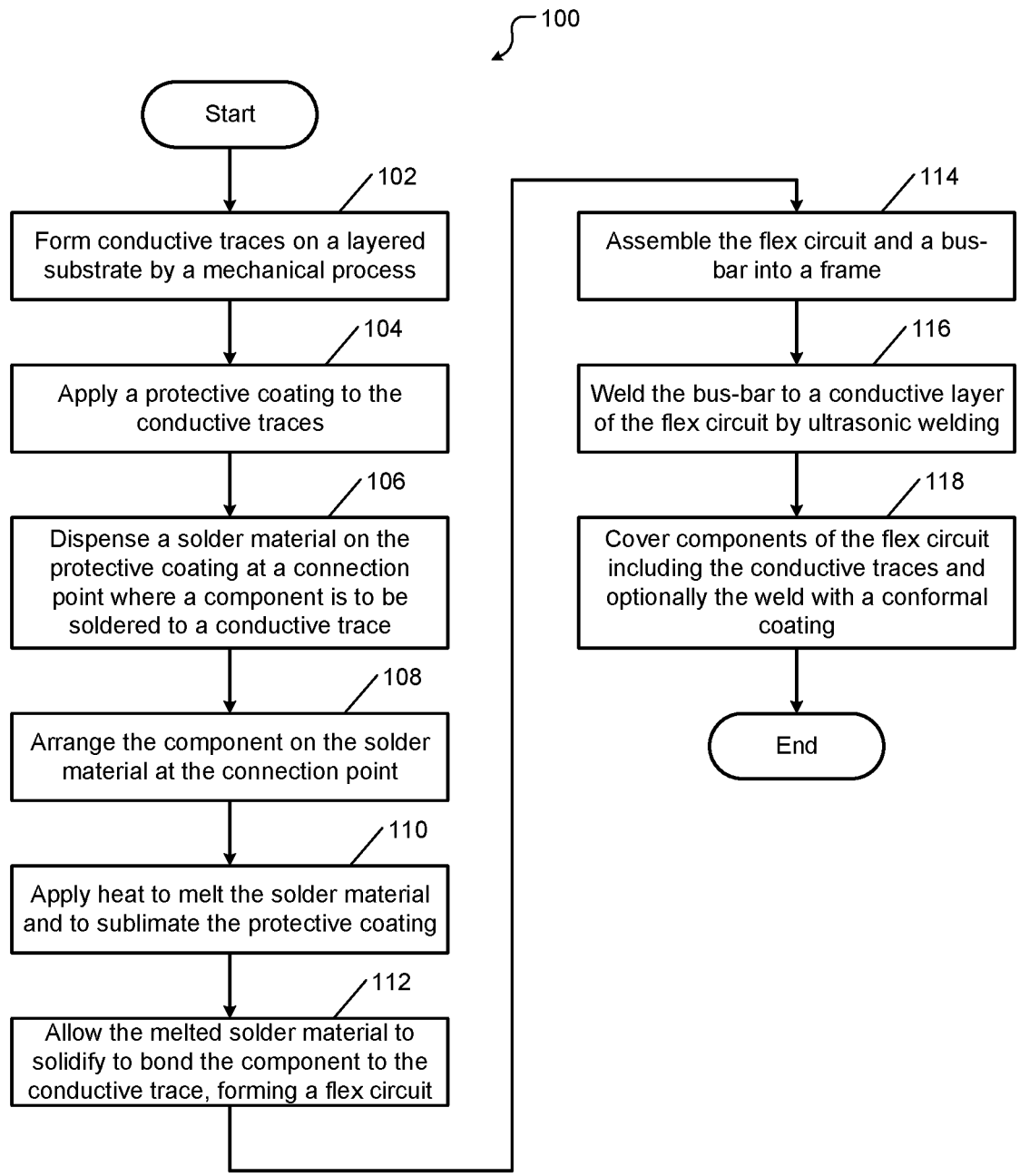
FIG. 9 is a first method of manufacturing a flexible (flex) circuit using the laminated substrate of FIG. 1 according to the present disclosure.
Figure 10:
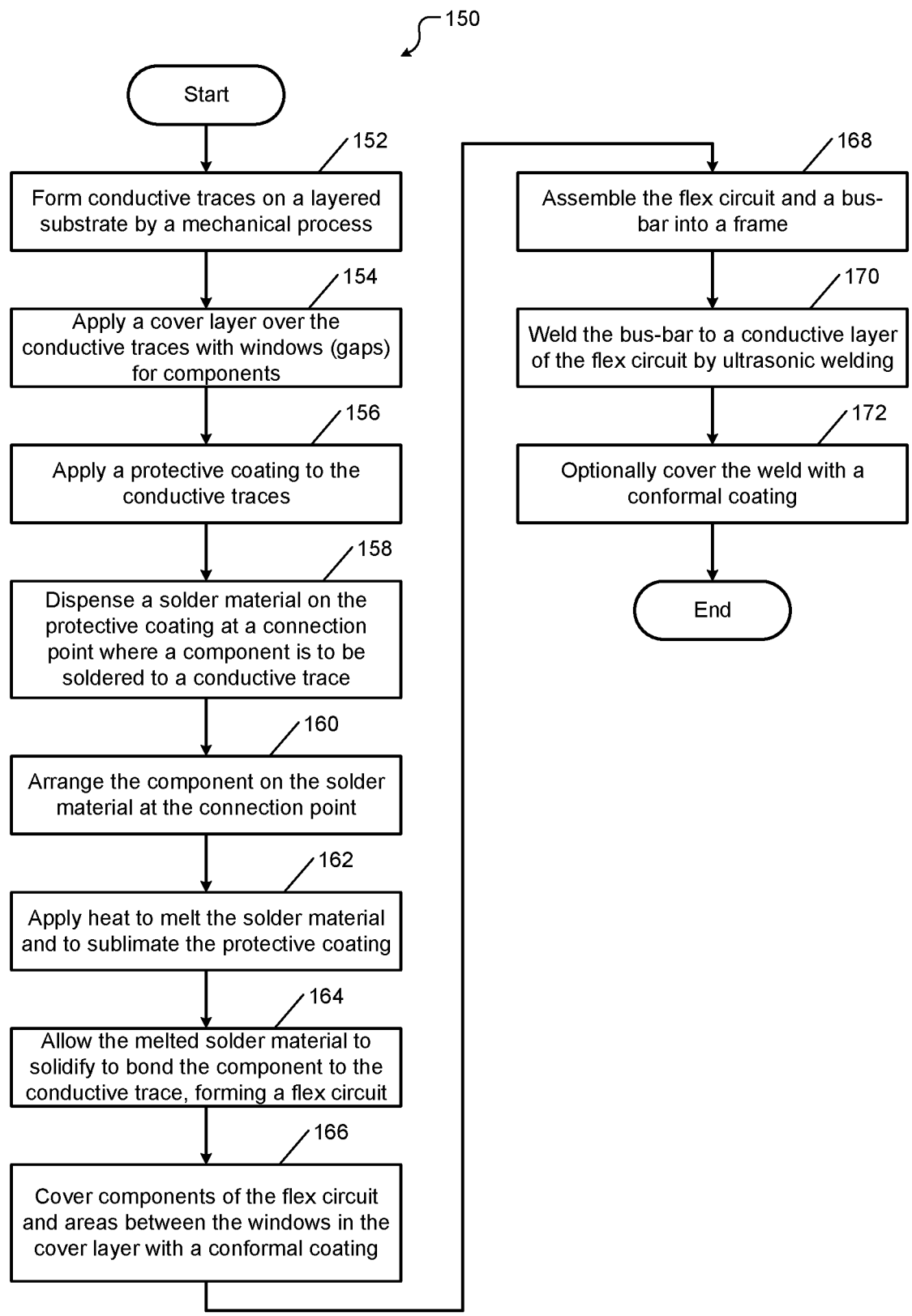
FIG. 10 is a second method of manufacturing a flex circuit using the laminated substrate of FIG. 1 according to the present disclosure.
Figure 11:
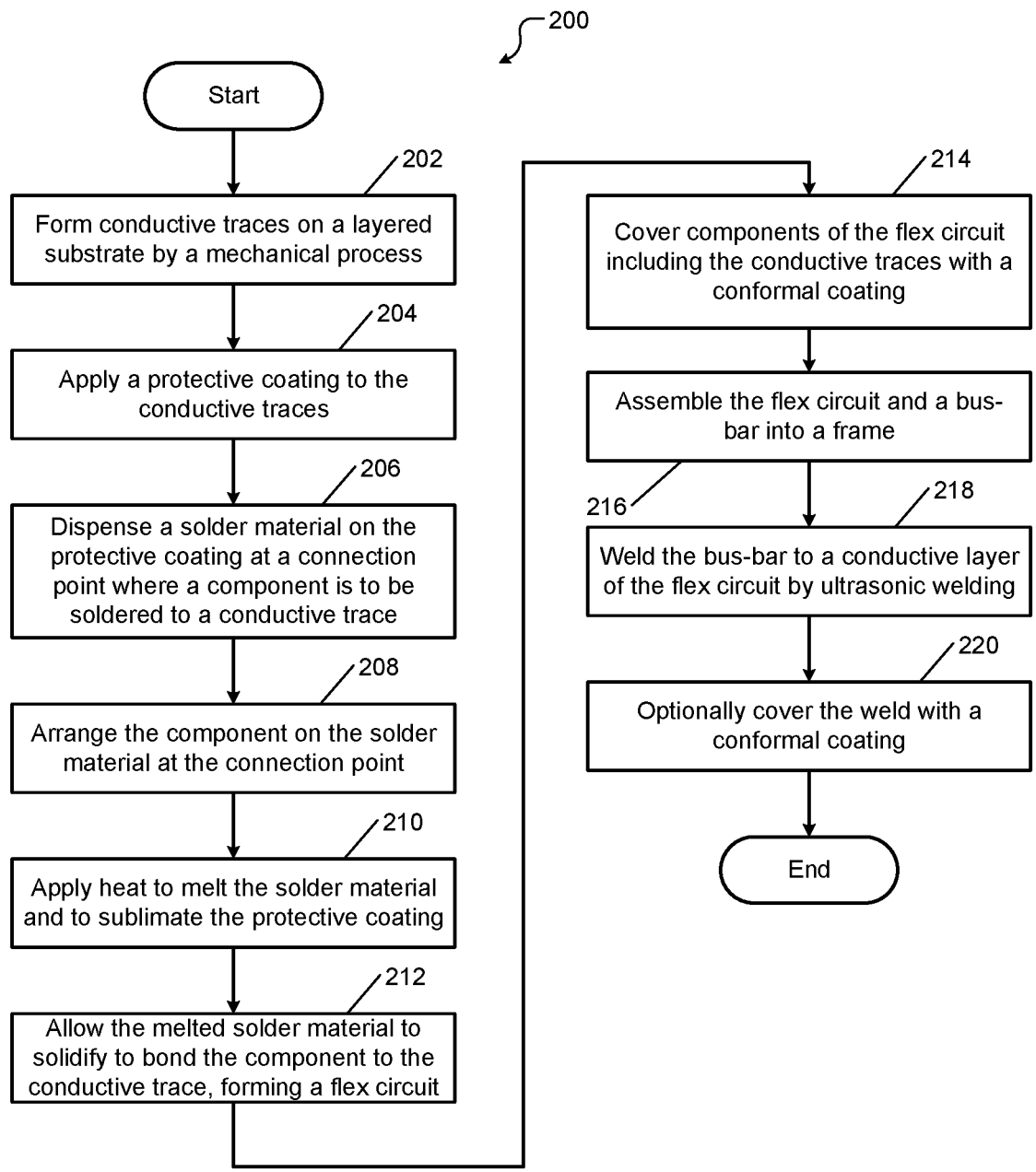
FIG. 11 is a third method of manufacturing a flex circuit using the laminated substrate of FIG. 1 according to the present disclosure.

FIGS. 9-11 show various methods of manufacturing flex circuits on a mass scale according to the present disclosure. In the following description of these methods, references are made to the various elements shown and described above with reference to FIGS. 1-8.

FIG. 9 shows a first method 100 for manufacturing a flex circuit according to the present disclosure. At 102, conductive traces (e.g., element 60) are formed on a layered substrate (e.g., element 58) by a mechanical process (e.g., dry milling). At 104, a protective coating (e.g., element 64) is applied to the conductive traces. At 106, a solder material (e.g., element 70) is dispensed on the protective coating. For example, the solder material is deposited at a first connection point where a first component (e.g., element 72) is to be soldered to a conductive trace. At 108, the first component is arranged on the solder material at the first connection point.

At 110, heat is applied to melt the solder material and to sublimate the protective coating. At 112, the melted solder is allowed to solidify to bond the first component to the conductive trace at the first connection point, forming a flex circuit. At 114, the flex circuit and a second component (e.g., element 80) are assembled into a frame. At 116, the second component is attached to the conductive trace (or to the conductive layer such as element 52 from which the conductive trace is formed) at a second connection point using a process different than soldering (e.g., a mechanical process such as ultrasonic welding). At 118, the first component, the conductive traces, and optionally the weld are covered with a conformal coating (e.g., element 94).

FIG. 10 shows a second method 150 for manufacturing a flex circuit according to the present disclosure. At 152, conductive traces (e.g., element 60) are formed on a layered substrate (e.g., element 58) by a mechanical process (e.g., dry milling). At 154, a cover layer (e.g., element 90) is applied over the conductive traces. The cover layer includes windows (gaps) for arranging components to be soldered to the conductive traces. At 156, a protective coating (e.g., element 64) is applied to the conductive traces (i.e., to portions of the conductive traces in the windows of the cover layer). At 158, a solder material (e.g., element 70) is dispensed at a first connection point in a window where a first component (e.g., element 72) is to be soldered to a conductive trace. At 160, the first component is arranged on the solder material at the first connection point.

At 162, heat is applied to melt the solder material and to sublimate the protective coating. At 164, the melted solder is allowed to solidify to bond the first component to the conductive trace at the first connection point, forming a flex circuit. At 166, the first component and areas between the windows in the cover layer are covered with a conformal coating (e.g., element 94).

At 168, the flex circuit and a second component (e.g., element 80) are assembled into a frame. At 170, the second component is attached to the conductive trace (or to the conductive layer such as element 52 from which the conductive trace is formed) at a second connection point using a process different than soldering (e.g., a mechanical process such as ultrasonic welding). At 172, the weld is optionally covered with the conformal coating (e.g., element 94).

FIG. 11 shows a third method 200 for manufacturing a flex circuit according to the present disclosure. At 202, conductive traces (e.g., element 60) are formed on a layered substrate (e.g., element 58) by a mechanical process (e.g., dry milling). At 204, a protective coating (e.g., element 64) is applied to the conductive traces. At 206, a solder material (e.g., element 70) is dispensed on the protective coating. For example, the solder material is dispensed at a first connection point where a first component (e.g., element 72) is to be soldered to a conductive trace. At 208, the first component is arranged on the solder material at the first connection point.

At 210, heat is applied to melt the solder material and to sublimate the protective coating. At 212, the melted solder is allowed to solidify to bond the first component to the conductive trace at the first connection point, forming a flex circuit. At 214, the first component and the conductive traces are covered with a conformal coating (e.g., element 94).

At 216, the flex circuit and a second component (e.g., element 80) are assembled into a frame. At 218, the second component is attached to the conductive trace (or to the conductive layer such as element 52 from which the conductive trace is formed) at a second connection point using a process different than soldering (e.g., a mechanical process such as ultrasonic welding). At 220, the weld is optionally covered with the conformal coating (e.g., element 94).

The above methods of manufacturing flex circuits according to the present disclosure provide many advantages including the following. First, since no chemicals are used in forming the conductive traces on the flex circuit, no cleaning of the flex circuit is required after forming the conductive traces, which results in less contamination and residual chemicals on the conductive traces or the substrate of the flex circuits.

Second, since the protective coating protects the conductive traces, no cleaning of the conductive traces or flex circuit is required before performing subsequent processes involving the conductive traces (e.g., soldering or other electrical connections), and negligible oxidation of the conductive traces occurs. As a result, the flex circuits can be stored for up to several months before subsequent processes involving the conductive traces are performed. Further, the protective coating process results in less contamination to the conductive traces or to the substrate of the flex circuits.

Third, heating the protective coating during subsequent processes (e.g., in a reflow oven during soldering process) causes the protective coating to be completely removed (by sublimation) from the conductive traces and the substrate, which provides clean conductive traces immediately before processes of the conductive traces. The heating also removes any environmental debris or chemicals that were deposited on the flex circuits and eliminates the need for a flux process for such removal.

Fourth, since conductors (e.g., bus-bars) are attached to the conductive traces by a mechanical process (e.g., ultrasonic welding), chemical contamination of the conductive traces during subsequent stages of manufacturing is also reduced and an improved connection of the conductors to the conductive traces results.

Figure 12:
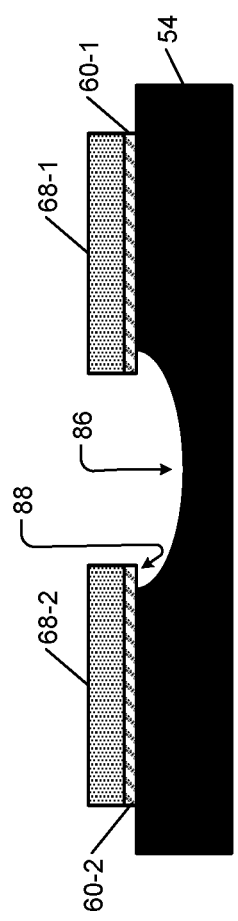
FIGS. 12 and 13 show side cross-sectional views of conductive traces formed by masking and etching a conductive layer using a chemical etch process.
Figure 13:
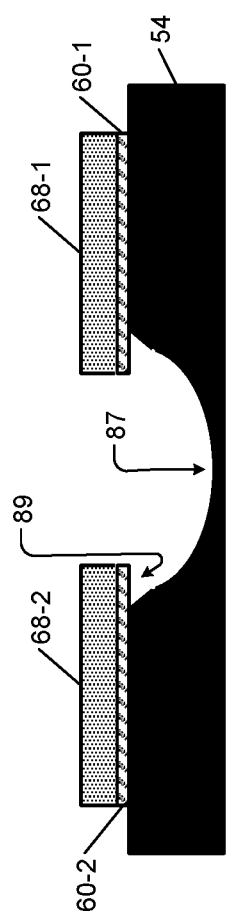

Additional advantages flow from using a mechanical process such as dry milling to form the conductive traces 60 as compared to a chemical etching process typically used. FIGS. 12 and 13 show side cross-sectional views of conductive traces formed by masking and etching a conductive layer using a chemical etch process. In FIGS. 12 and 13, a mask layer comprising mask lines 68-1, 68-2 (collectively mask layer 68) is disposed on the conductive layer 52 (see FIG. 1). The mask lines 68-1, 68-2 mark where the conductive traces 60-1, 20-2 are to be formed on the conductive layer 52. Specifically, the mask lines 68-1, 68-2 are arranged on the conductive layer 52 such that a portion of the conductive layer 52 between the mask lines 68-1, 68-2 is etched during a chemical etching process. Following the chemical etching process and subsequent cleaning, the mask lines 68-1, 68-2 are removed to yield the conductive traces 60-1, 60-22.

The chemical etching process also etches a portion of the adhesive layer 54 as shown at 68 and causes an undercut below the conductive traces 60-1, 60-22 as shown at 88. That is, the chemical etching process removes a portion of the adhesive layer 54 from under the edges of the conductive traces 60-1, 60-22. The extent of the undercut 88 is proportional to the thickness of the conductive layer 52 (i.e., the thickness of the conductive traces 60-1, 60-22). The undercut 88 causes several problems.

For example, the conductive traces 60-1, 60-22 tend to bend at the edges due to lack of support underneath the edges since the chemical etching process removes a portion of the adhesive layer 54 from under the edges of the conductive traces 60-1, 60-22. Additionally, the conductive traces 60-1, 60-22 tend to peel off over time due to poor adhesion since the chemical etching process removes a portion of the adhesive layer 54 from under the edges of the conductive traces 60-1, 60-22. These problems degrade the quality of bonding of components to the conductive traces 60-1, 60-22 (e.g., by soldering, welding, etc.) and reduces the life of the flex circuits formed using the chemical etching process.

Figure 14:
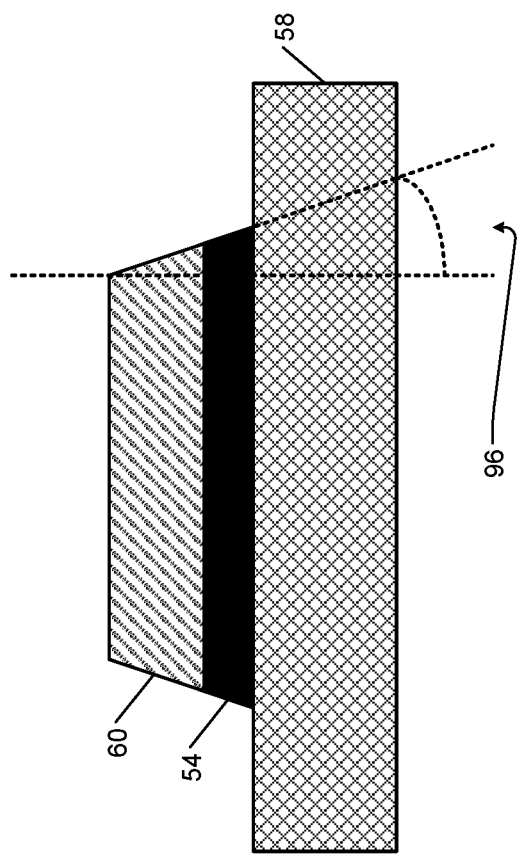
FIGS. 14 and 15 show side cross-sectional views of a conductive trace formed by a mechanical process such as dry milling.
Figure 15:
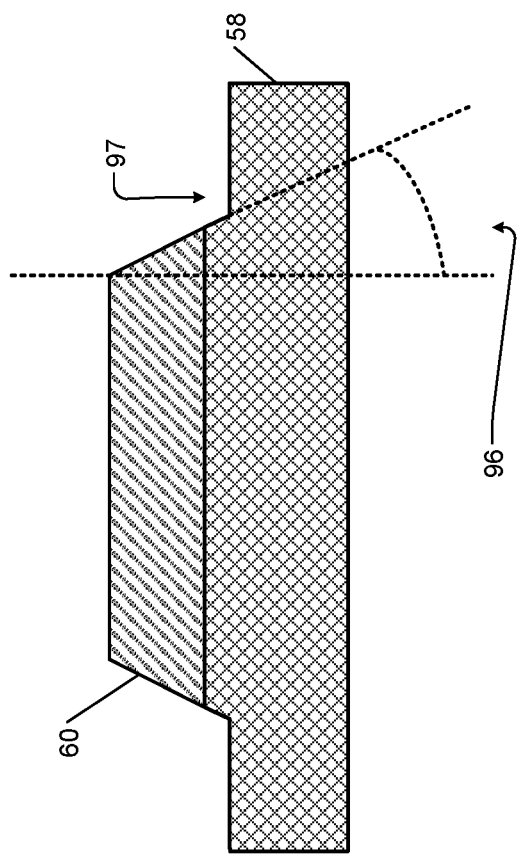

FIGS. 14 and 15 show side cross-sectional views of a conductive trace formed by a mechanical process such as dry milling. FIG. 14 shows a conductive trace formed by removing portions of the conductive layer 52 and the adhesive layer 54 (see FIG. 1) by using a mechanical process such as dry milling. FIG. 15 shows a conductive trace formed by removing portions of the conductive layer 52 (the adhesive layer 54 is not used) by using a mechanical process such as dry milling.

In FIG. 14, the dry milling process produces the conductive traces 60 having a pyramid-like shape or a trapezoidal shape. Specifically, using the dry milling process, the conductive layer 52 (see FIG. 1) is cut such that the edges of the conductive traces 60 taper downwards and outwardly towards the adhesive layer 54 and the support layer 58 at an acute angle relative to an axis perpendicular to the plane of the layers 52, 54, 58. The edges of the conductive traces 60 taper outwardly relative to the center of the conductive traces 60.

Further, the adhesive layer 54 is also cut along the same acute angle. As a result, the edges of the adhesive layer 54 also taper downwards and outwardly towards the support layer 58 at the acute angle relative to an axis perpendicular to the plane of the support layer 58. The edges of the adhesive layer 54 taper outwardly relative to the center of the conductive traces 60. The edges of the adhesive layer 54 extend outwardly beyond the edges of the conductive traces 60. The edges of the adhesive layer 54 are aligned with the edges of the conductive traces 60.

Accordingly, while the undercuts 88 produced by the chemical etching process weaken or erode the support under the edges of the conductive traces 60, the dry milling process reinforces or strengthens support under the edges of the conductive traces 60. This enhances the quality bonding of components to the conductive traces 60-1, 60-22 (e.g., by soldering, welding, etc.) and increases the life of the flex circuits formed using the dry milling process.

In FIG. 15, the adhesive layer 54 is not used. Similar to FIG. 14, the dry milling process produces the conductive traces 60 having a pyramid-like shape or a trapezoidal shape. Specifically, using the dry milling process, the conductive layer 52 (see FIG. 1) is cut such that the edges of the conductive traces 60 taper downwards and outwardly towards the support layer 58 at an acute angle relative to an axis perpendicular to the plane of the support layer 58. The edges of the conductive traces 60 taper outwardly relative to the center of the conductive traces 60. The dry milling process extends and removes a relatively small portion of the support layer 58 as shown at 97. The extent or the depth of the portion 97 is controlled during dry milling and is not detrimental to the quality and life of the flex circuit.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure.

Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A method of manufacturing a flexible circuit, comprising:
   providing a laminated substrate that includes a conductive layer, an adhesive layer, and a support layer;
   forming conductive traces by removing selected portions of the conductive layer and the adhesive layer by dry milling the laminated substrate;
   applying a protective coating to the conductive traces;
   dispensing a solder material on the protective coating at a first connection point;
   arranging a first component at the first connection point;
   heating the solder material to remove the protective coating from the first connection point and to connect the first component to one of the conductive traces at the first connection point; and
   attaching a second component to the conductive layer at a second connection point by a process other than soldering, wherein the second connection point is free of the protective coating.

2. The method of claim 1, further comprising, prior to dispensing the solder material, curing the protective coating by heating the protective coating.

3. The method of claim 1 wherein the support layer includes a material selected from a group consisting of polyethylene terephthalate (PET), polyethylene naphthalate (PEN), and polyimide (PI).

4. The method of claim 1 wherein the conductive layer includes aluminum.

5. The method of claim 1 wherein the second component includes a bus-bar made of aluminum.

6. The method of claim 1 wherein the second component includes a conductor made of a different material than the conductive layer.

7. The method of claim 1 further comprising covering the first component and the conductive traces with a conformal coating.

8. The method of claim 1 wherein the second component includes a bus-bar, and wherein the process includes ultrasonic welding.

9. The method of claim 8 further comprising covering the first component, the conductive traces, and a weld at the second connection point with a conformal coating.

10. The method of claim 1 further comprising, prior to applying the protective coating, applying a cover layer over the conductive traces, wherein the cover layer includes windows for components to connect to the conductive traces.

11. The method of claim 10 wherein the cover layer and the support layer include a material selected from a group consisting of polyethylene terephthalate (PET), polyethylene naphthalate (PEN), and polyimide (PI).

12. The method of claim 10 further comprising, subsequent to heating the solder material and prior to attaching the second component, covering the first component and areas between the windows in the cover layer with a conformal coating.

13. The method of claim 12 wherein the second component includes a bus-bar, and wherein the process includes ultrasonic welding.

14. The method of claim 13 wherein the bus-bar is made of a different conductive material than the conductive layer.

15. The method of claim 13 further comprising covering a weld at the second connection point with the conformal coating.

16. The method of claim 1 further comprising, subsequent to heating the solder material and prior to attaching the second component, covering the first component and the conductive traces with a conformal coating.

17. The method of claim 16 wherein the second component includes a bus-bar, and wherein the process includes ultrasonic welding.

18. The method of claim 17 wherein the bus-bar is made from a different conductive material than the conductive layer.

19. The method of claim 17 further comprising covering a weld at the second connection point with the conformal coating.

* * * * *